US012719247B2

(12) United States Patent
Yamashita et al.

(10) Patent No.: US 12,719,247 B2
(45) Date of Patent: Aug. 25, 2026

(54) WORK DEVICE

(71) Applicant: YAMAHA HATSUDOKI KABUSHIKI KAISHA, Iwata (JP)

(72) Inventors: Shingo Yamashita, Shizuoka (JP); Naoto Nakagawa, Shizuoka (JP); Tomoyasu Arai, Shizuoka (JP)

(73) Assignee: YAMAHA HATSUDOKI KABUSHIKI KAISHA, Iwata (JP)

( * ) Notice: Subject to any disclaimer, the term of this patent is extended or adjusted under 35 U.S.C. 154(b) by 210 days.

(21) Appl. No.: 18/729,447

(22) PCT Filed: Jan. 20, 2022

(86) PCT No.: PCT/JP2022/002060
§ 371 (c)(1),
(2) Date: Jul. 16, 2024

(87) PCT Pub. No.: WO2023/139733
PCT Pub. Date: Jul. 27, 2023

(65) Prior Publication Data

US 2025/0118953 A1 Apr. 10, 2025

(51) Int. Cl.
*H02G 3/04* (2006.01)
*H02G 3/00* (2006.01)
*H05K 13/04* (2006.01)

(52) U.S. Cl.
CPC ........... *H02G 3/0487* (2013.01); *H02G 3/263* (2013.01); *H05K 13/0406* (2018.08); *H05K 13/0411* (2018.08)

(58) Field of Classification Search
CPC .... H02G 3/0487; H02G 3/263; H02G 3/0462; H02G 3/06; H02G 3/22; H02G 3/28;
(Continued)

(56) References Cited

U.S. PATENT DOCUMENTS 3,590,854 A * 7/1971 Cork .................... H02G 11/006 248/49
6,781,058 B1 * 8/2004 DeCicco ............. H02G 11/006 174/72 A (Continued)

FOREIGN PATENT DOCUMENTS

CN 205882590 U 1/2017
JP H03-001627 U 1/1991

(Continued)

OTHER PUBLICATIONS

International Search Report issued in PCT/JP2022/002060; mailed Apr. 12, 2022.

*Primary Examiner* — Angel R Estrada
(74) *Attorney, Agent, or Firm* — Studebaker Brackett PLLC

(57) ABSTRACT

A work device includes: a movable work unit that performs a predetermined process on an object; a cable carrier that includes a first end, a second end, and a folded portion, and houses and holds a cable connected to the work unit; a fixing portion that fixes the first end of the cable carrier to a predetermined position above a movable region of the work unit; a movable section that moves together with the work unit, the second end of the cable carrier being fixed to the movable section; and an elastic member that biases the cable carrier upward in a region between the folded portion and the first end to prevent the cable carrier from sagging.

20 Claims, 11 Drawing Sheets

(58) Field of Classification Search
CPC ............... H02G 11/00; H05K 13/0406; H05K 13/0411; H05K 13/04; H05K 13/0404; H05K 13/08; F16G 13/16
USPC ....... 174/68.3, 68.1, 72 A, 73.1, 74 R, 70 C, 174/88 R; 248/68.1, 49, 74.1, 74.2; 138/118, 118.1
See application file for complete search history.

(56) References Cited

U.S. PATENT DOCUMENTS

| | | | | |
|---|---|---|---|---|
| 6,984,782 | B2 * | 1/2006 | Ikeda | F16G 13/16<br>174/68.1 |
| 7,741,563 | B2 * | 6/2010 | Harada | H02G 3/0475<br>174/72 A |
| 7,829,789 | B2 * | 11/2010 | Yamaguchi | B60N 2/0224<br>174/72 A |
| 8,662,456 | B2 * | 3/2014 | Komiya | H02G 11/006<br>248/68.1 |
| 9,029,698 | B2 * | 5/2015 | Komiya | H02G 3/04<br>174/72 A |
| 9,576,705 | B2 * | 2/2017 | Shin | H02G 11/00 |
| 10,311,999 | B2 * | 6/2019 | Sung | H02G 11/00 |
| 10,718,407 | B2 * | 7/2020 | Tetsuka | F16G 13/06 |
| 2006/0042175 | A1 | 3/2006 | Crespi | |

FOREIGN PATENT DOCUMENTS

| | | | |
|---|---|---|---|
| JP | 2004-194424 | A | 7/2004 |
| JP | 2008-243839 | A | 10/2008 |
| JP | 2012-028464 | A | 2/2012 |
| JP | 2019-071747 | A | 5/2019 |
| KR | 10-2011-0106131 | A | 9/2011 |

* cited by examiner 10
12
11
13
15
12a
11a
11b
30
20C
6C
2
30
3A
P
20A
3B
P
13
6A
6D
12a
30
20B
30
20D
6B
15
11a
16
11c
2a
4B
X
Y
Z
(X1)
(X2)
(Y1)
(Y2)
(Z1)
(Z2)

WORK DEVICE

CROSS-REFERENCE TO RELATED APPLICATION

This application claims benefit of priority to International Patent Application No. PCT/JP2022/002060, filed Jan. 20, 2022, the entire contents of which are incorporated herein by reference.

BACKGROUND

Technical Field

The present disclosure relates to a work device including a movable work unit that performs various processes (work) on an object.

Background Art

Conventionally, a work device has been well known that includes a work unit capable of reciprocating for performing various processes on an object placed at a work position and a fixed side device in which a power supply, a control device, and the like are housed, where the work unit and the fixed side device are connected to each other with a cable for power supply, signal transmission and reception, and the like.

In this type of work device, from the viewpoint of cable protection, the work unit and the fixed side device may be coupled to each other via a U-shaped folded cable carrier, and cables may be housed and held in the cable carrier. The cable carrier is a bendable cable protection guide member in which a plurality of blocks made of metal or resin is coupled in a chain shape. For example, this is widely known under the name CABLEVEYOR (registered trademark). The cable carrier can be bent into a U shape with a fixed radius, and has a structure that regulates bending in the opposite direction to the bending direction. With this structure, the cable carrier follows the work unit while keeping the portion other than the U-shaped folded portion substantially straight.

In the work device described above, one end of the cable carrier may be fixed to a horizontally reciprocating work unit, whereas the other end may be fixed to a specific position above the movable region of the work unit. Such a configuration has the following problems. That is, if the work unit moves and the lower straight section of the cable carrier lengthens, the weight of the straight section causes the cable carrier to sag. This results in stress concentrating on the fixing portion at the one end of the cable carrier, and in the worst case, it is conceivable that the fixing portion may be damaged. Therefore, it is desirable to suppress the occurrence of such troubles.

Note that as one of the technologies that can help solve the problems, to suppress the slack in the cable carrier, JP 2019-71747 A discloses a cable carrier including therein a long reinforcing member that has flexibility and elasticity (for example, resin or rubber hose). However, with this cable carrier, since the weight of the cable carrier increases by the long reinforcing member, there are concerns about the impact on the operating speed of the work unit and the like.

SUMMARY

The present disclosure has been made in view of the circumstance described above, and, in a type of work device that includes a movable work unit and in which a cable connected to the work unit is housed and held in a cable carrier, provides a technology that can suppress damage to the cable carrier without affecting the operating speed of the work unit and the like.

A work device according to one aspect of the present disclosure includes a movable work unit that performs a predetermined process on an object; a cable carrier that includes a first end, a second end, and a folded portion that is folded in an up-and-down direction between the first end and the second end, the cable carrier housing and holding a cable connected to the work unit; a fixing portion that fixes the first end of the cable carrier to a predetermined position above a movable region of the work unit; a movable section that moves together with the work unit, the second end of the cable carrier being fixed to the movable section; and an elastic member that biases the cable carrier upward in a region between the folded portion and the first end to prevent the cable carrier from sagging.

BRIEF DESCRIPTION OF THE DRAWINGS

FIG. 13 is a side view showing an elastic member according to a seventh embodiment.

DETAILED DESCRIPTION

Preferred embodiments of the present disclosure will be described in detail below with reference to the accompanying drawings.

Overall Configuration of Component Mounting Device

Figure 1:
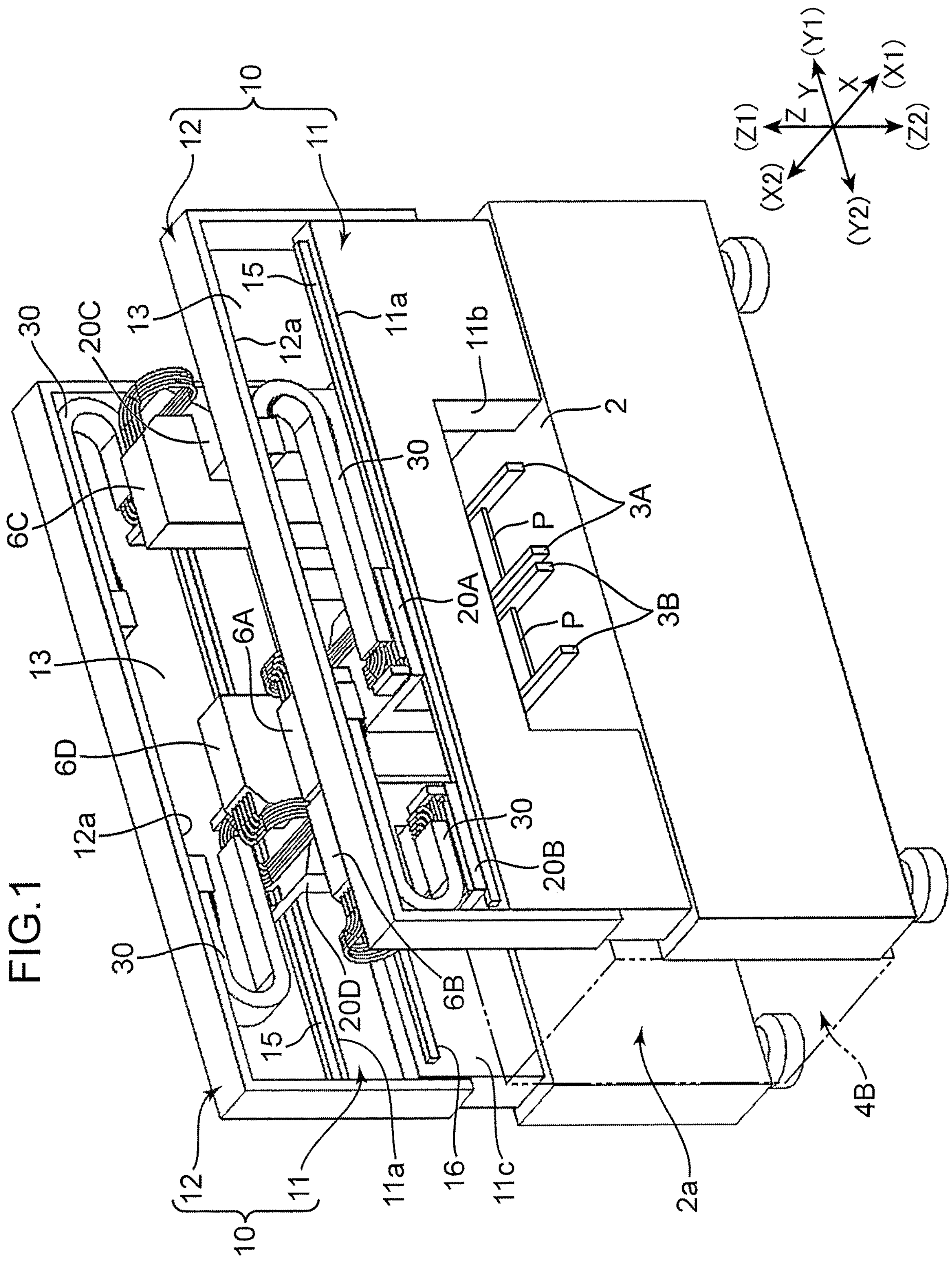
FIG. 1 is a perspective view showing a component mounting device, which is a work device according to the present disclosure.
Figure 2:
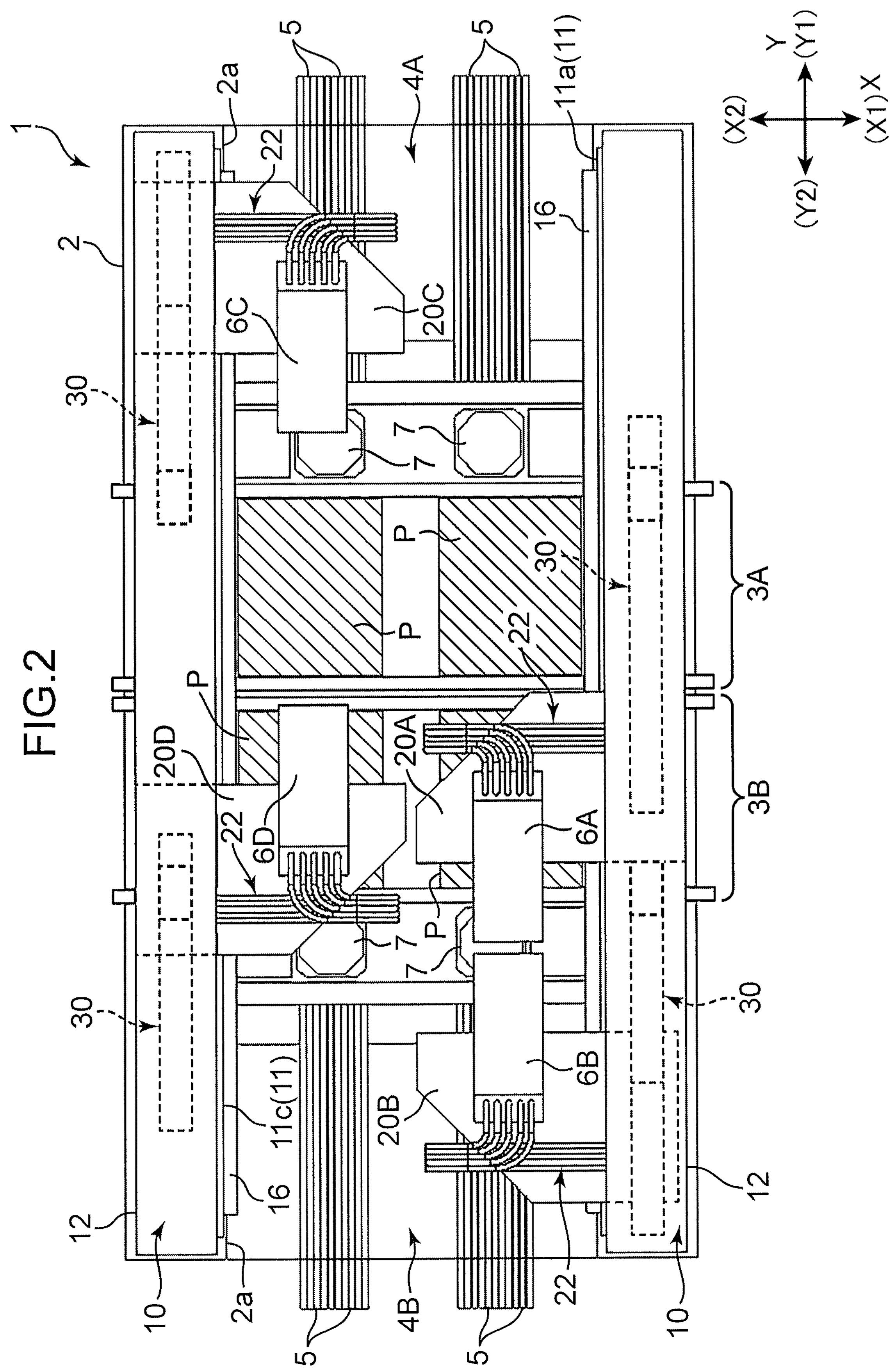
FIG. 2 is a plan view of the component mounting device.

FIG. 1 is a perspective view showing a component mounting device 1, which is one example of a work device according to the present disclosure, and FIG. 2 is a plan view of the component mounting device 1. The component mounting device is a device that performs a process of mounting (loading) a component (surface mount device) on a board P such as a printed wiring board. In the figures, XYZ orthogonal coordinate axes are shown to clarify directional relationships. The X direction is a direction parallel to the horizontal plane, the Y direction is a direction orthogonal to the X direction on the horizontal plane, and the Z direction is a direction orthogonal to both the X and Y directions, that is, the up-and-down direction.

The component mounting device 1 includes a base 2 including a metal structure, two board conveyance mechanisms 3A and 3B that convey the boards P on the base 2, two component supply units 4A and 4B, and four head units 6A to 6D each moving along and above the base 2. Each of the four head units 6A to 6D corresponds to the "work unit" of the present disclosure.

Each of the board conveyance mechanisms 3A and 3B has a pair of conveyors including belt conveyors. Each of the board conveyance mechanisms 3A and 3B receives the board P (indicated by hatching) from the lower side (X1 side) in FIG. 2 and conveys the board to the work position (position of the board P shown in the figure), and then conveys out the board P from the work position to the upper side (X2 side) in the figure after completing the mounting work. At the work position, the board P is positioned and held while being lifted from the conveyor by a positioning mechanism (not shown). In this example, two work positions adjacent to each other in the X direction are set for each of the board conveyance mechanisms 3A and 3B. As a result, the four boards P are simultaneously positioned at the work position.

Out of the two component supply units 4A and 4B, one component supply unit 4A is provided on the Y1 side of the board conveyance mechanisms 3A and 3B, whereas the other component supply unit 4B is provided on the Y2 side of the board conveyance mechanisms 3A and 3B. Each of the component supply units 4A and 4B includes a movable unit member provided with a plurality of tape feeders 5, and is set from the side in a recess 2*a* provided on each of both sides of the base 2 in the Y direction, as shown in FIG. 1.

Each of the head units 6A to 6D (first head unit 6A to fourth head unit 6D) picks a component from the tape feeder 5 provided in either of the component supply units 4A and 4B, moves to the work position, and loads the component on the board P. In more detail, the first head unit 6A and the second head unit 6B can move within the region on the X1 side of the center in the X direction in a space above the base 2, pick components from the tape feeders 5 placed in the region on the X1 side, and load the components on the boards P placed at the two work positions on the X1 side. Meanwhile, the third head unit 6C and the fourth head unit 6D can move within the region on the X2 side of the center in the X direction in the space above the base 2, pick components from the tape feeders 5 placed in the region on the X2 side, and load the components on the boards P placed at the two work positions on the X2 side. With this configuration, the component mounting device 1 can perform the component mounting process on the four boards P in parallel.

Frames 10 extending in the Y direction are provided at both ends of the upper surface of the base 2 in the X direction. Each of the frames 10 is made of a metal structure having a rectangular wall shape in plan view. The head units 6A to 6D are supported by these frames 10 as follows.

Each frame 10 includes a lower frame 11 and an upper frame 12. The lower frame 11 has a gate shape including a notch-shaped opening 11*b* at the lower center in the Y direction. Through these openings 11*b*, the board conveyance mechanisms 3A and 3B receive the boards P and convey out the boards P.

The lower frame 11 includes a substantially horizontal upper surface 11*a* extending in the Y direction. Guide rails 15 and 16 are fixed to the upper surface 11*a* and an inner side surface of the lower frame 11, that is, an opposing surface between the lower frames 11 in the frames 10, respectively. A first head support member 20A and a second head support member 20B are movably supported by the guide rails 15 and 16 of the frame 10 on the X1 side. The first head unit 6A is supported by the first head support member 20A, whereas the second head unit 6B is supported by the second head support member 20B. A third head support member 20C and a fourth head support member 20D are movably supported by the guide rails 15 and 16 of the frame 10 on the X2 side. The third head unit 6C is supported by the third head support member 20C, whereas the fourth head unit 6D is supported by the fourth head support member 20D. Note that each of the head support members 20A to 20D corresponds to the "movable section" of the present disclosure.

Each of the head support members 20A to 20D is driven by a linear motor (not shown) and moves along the guide rails 15 and 16 in the Y direction. The head units 6A to 6D are supported movably in the X direction with respect to the head support members 20A to 20D, respectively, and are driven by a linear motor (not shown). With this configuration, the first head unit 6A and the second head unit 6B are movable in the X-Y direction in the region on the X1 side of the center in the X direction in the space above the base 2. Meanwhile, the third head unit 6C and the fourth head unit 6D are movable in the X-Y direction in the region on the X2 side of the center in the X direction in the space above the base 2.

Each of the head units 6A to 6D is provided with a plurality of axial heads (not shown) that can adsorb components. Each head can move in the Z direction and in the R direction (around the vertical axis), and is moved in each direction by a drive mechanism using a motor as a drive source. Each head can communicate with any one of a negative pressure generation device, a positive pressure generation device, and the atmosphere via an electric switching valve. The supply of negative pressure to the head enables adsorption of a component. After that, the supply of positive pressure releases the adsorption of the component. That is, when picking a component from the tape feeder 5, the head descends to adsorb the component, and then ascends. When loading a component onto the board P, the head descends and releases the component onto the board P by releasing the adsorption of the component.

Routing Structure of Cable 22

Fixed side devices such as a power supply and a control device for driving each of the head units 6A to 6D are provided in the base 2. Each of the head units 6A to 6D and the fixed side device are connected to each other via a cable 22. The cable 22 includes, for example, electric cables for supplying power and transmitting and receiving control signals to and from a linear motor that drives each of the head units 6A to 6D, a motor for the drive mechanism that drives each head, and the like (wire harness), and air pipes that supply negative/positive pressure to each head. Note that the cable 22 may include electric cables and pipes other than those listed above, depending on devices loaded on the head units 6A to 6D.

As shown in FIGS. 1 and 2, the cable 22 connected to each of the head units 6A to 6D is routed from the head support members 20A to 20D to the upper frame 12 of the frame 10 through a cable carrier 30. Then, although illustration is omitted, the cable 22 is further routed from the upper frame 12 along the lower frame 11 and introduced into the base 2.

The upper frame 12 is disposed above the lower frame 11, and is coupled to the lower frame 11 at both ends in the Y direction. The upper frame 12 includes a substantially horizontal lower surface 12*a* facing the upper surface 11*a* of the lower frame 11 across a gap 13 and extending parallel to the upper surface 11*a* in the Y direction. The cable carrier 30 is provided across the lower surface 12*a* and the upper surfaces of the head support members 20A to 20D (portions facing the lower surface 12*a*).

The cable carrier 30 is, for example, a bendable cable protection guide member in which a housing space for the cable 22 is formed inside by a plurality of box-shaped blocks made of metal or resin being coupled in a chain shape. The cable carrier 30 can be bent (curved) into a U shape with a fixed radius, and is configured such that the bending in the opposite direction to the bending direction is regulated.

Mounting Structure of Cable Carrier 30

Next, the mounting structure of the cable carrier 30 and the operational effect will be described by taking, as an example, mounting structure of the cable carrier 30 in which the cable 22 of the second head unit 6B is housed and held.

Figure 3:
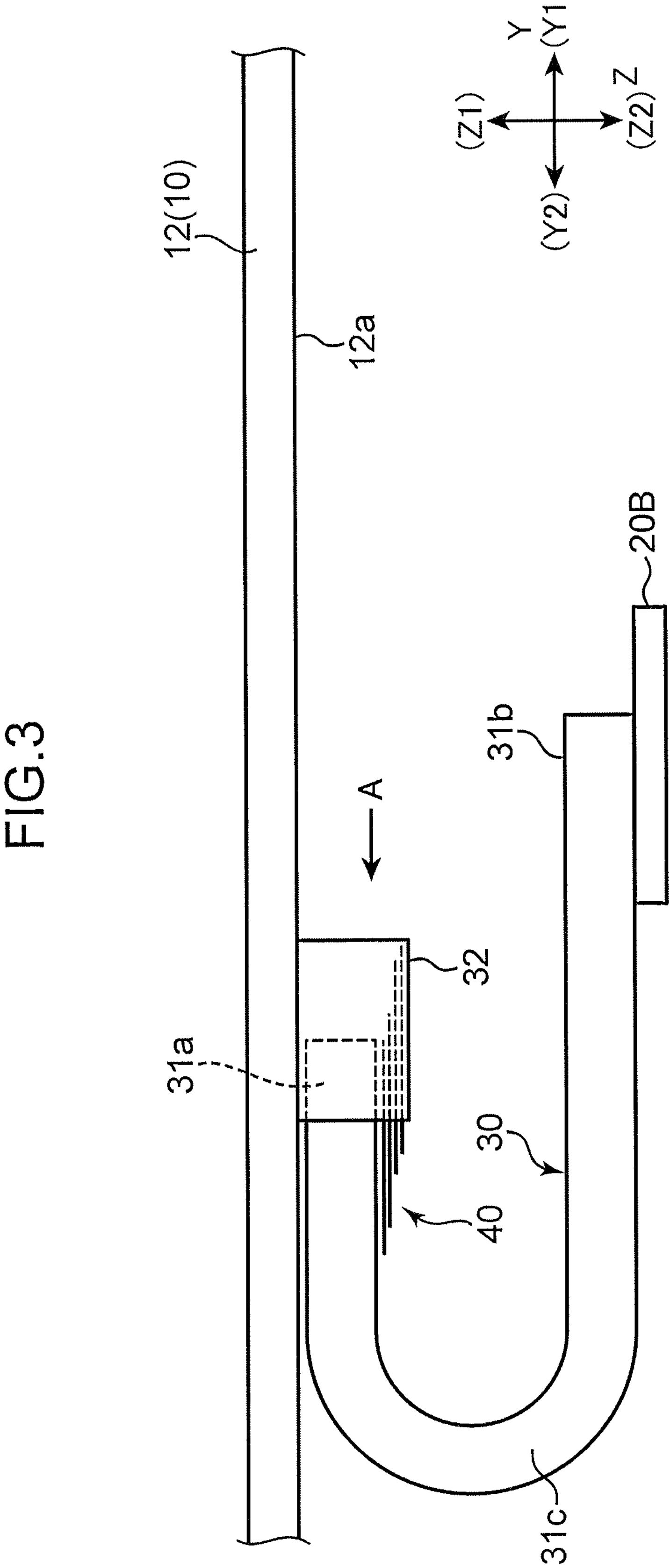
FIG. 3 is a side view showing the mounting structure of a cable carrier.

FIG. 3 is a side view showing the mounting structure of the cable carrier 30 in which the cable 22 of the second head unit 6B is housed and held (side view seen from the X1 side). Note that FIG. 3 shows the cable carrier 30 in a state where a second end 31*b* (described later) is located closer to the Y1 side than a first end 31*a*.

The cable carrier 30 includes the first end 31*a* and the second end 31*b*. The cable carrier 30 is folded back in a U shape between the first end 31*a* and the second end 31*b*, in more detail, is folded back in the up-and-down direction to curve outward of the component mounting device 1 in the Y direction.

The first end 31*a* of the cable carrier 30 is fixed to the lower surface 12*a* of the upper frame 12 via a bracket 32 (corresponding to the "fixing portion" of the present disclosure), whereas the second end 31*b* is fixed to the upper surface of the second head support member 20B. The fixing position of the first end 31*a* by the bracket 32 is set within the movable region of the second head unit 6B (second head support member 20B). That is, the bracket 32 fixes the first end 31*a* to a predetermined position above the movable region of the second head unit 6B (second head support member 20B). As a result, the portion between the folded portion of the cable carrier 30 (referred to as folded portion 31*c*) and the first end 31*a*, and the portion between the folded portion 31*c* and the second end 31*b* are kept substantially straight and parallel. Then, when the second head support member 20B moves in the Y direction, the second end 31*b* of the cable carrier 30 follows the second head support member 20B while changing the position of the folded portion 31*c*.

The cable 22 (not shown in FIG. 3) is housed and held in the cable carrier 30, thereby preventing unnecessary slack and excessive bending of the cable 22 as the second head unit 6B moves, and protecting the cable 22 from outside.

Note that when the second head unit 6B (second head support member 20B) moves and the distance from the folded portion 31*c* of the cable carrier 30 to the second end 31*b* increases, as will be detailed later, there is a possibility that the cable carrier 30 will sag due to its weight and the cable carrier 30 will be damaged at the fixing portion of the second end 31*b*. Therefore, in the component mounting device 1, to prevent the cable carrier 30 from sagging, the bracket 32 is provided with an elastic member 40 that biases the cable carrier 30 upward in the region between the folded portion 31*c* and the first end 31*a*.

Figure 4:
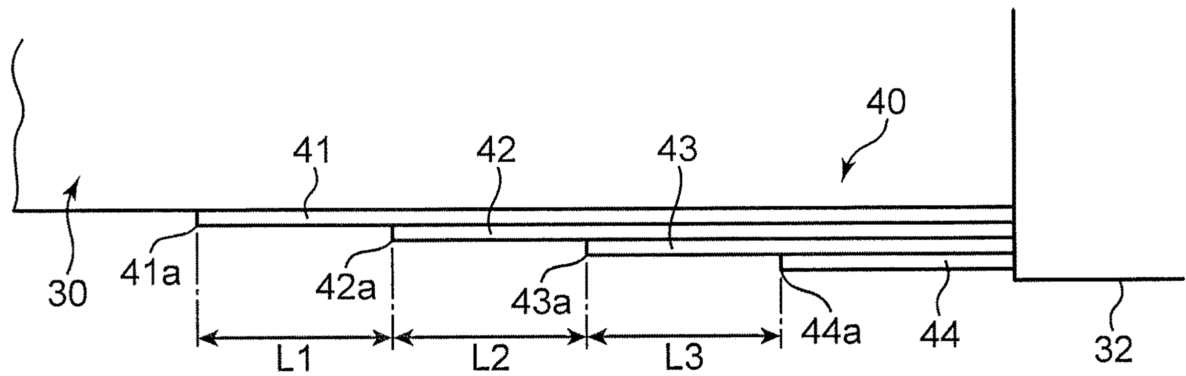
FIG. 4 is an enlarged view of the main part of FIG. 3 showing the mounting structure of the cable carrier.
Figure 5:
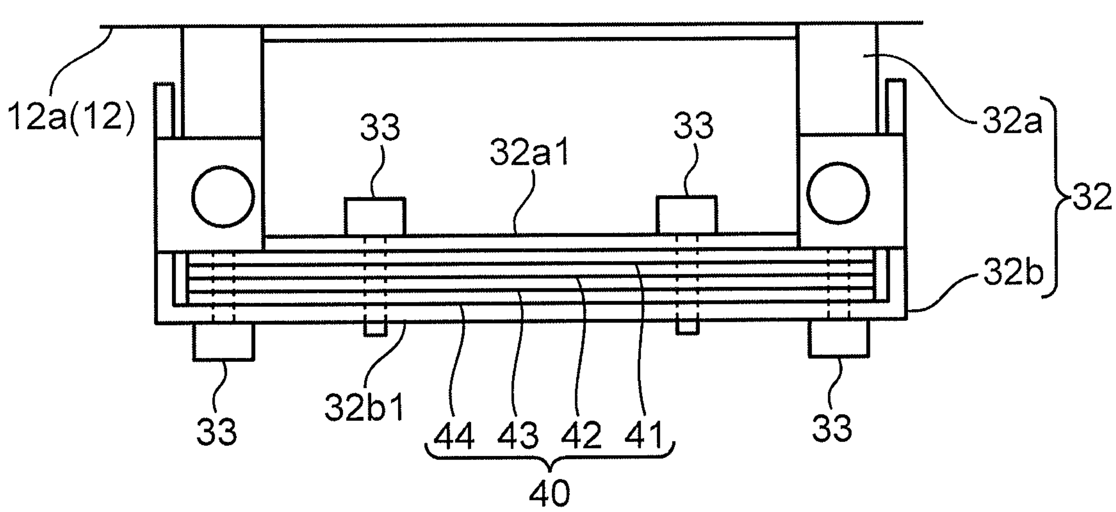
FIG. 5 is a view taken along the arrow A in FIG. 3, showing the mounting structure of the cable carrier.

The elastic member 40 includes, as shown in FIGS. 3 to 5, a plurality of leaf springs 41 to 44 stacked in the up-and-down direction, and biases the cable carrier 30 upward at a position adjacent to the bracket 32 to prevent the cable carrier 30 from sagging. Note that FIG. 4 is an enlarged view of the main part of FIG. 3, and FIG. 5 is a view taken along the arrow A in FIG. 3, showing the mounting structure of the cable carrier 30.

Each of the leaf springs 41 to 44 is the same leaf spring. That is, each of the leaf springs 41 to 44 is a leaf spring that is made of the same metal material (for example, stainless steel) and is elongated in the Y direction, has the same shape, and has the same thickness. In this example, the shape of each of the leaf springs 41 to 44 is a rectangle that is elongated in the Y direction in plan view. The width (size in the X direction) is set to be substantially the same as the width of the cable carrier 30.

Each of the leaf springs 41 to 44 is sequentially offset by equal size in the Y direction such that the tip of the leaf spring located on the upper side is located closer to the folded portion 31*c* (Y2 side) than the tip of the leaf spring located directly below. That is, each of the leaf springs 41 to 44 is stacked such that the distance L1 between a tip 41*a* of the uppermost leaf spring 41 and a tip 42*a* of the leaf spring 42 directly below, the distance L2 between the tip 42*a* of the leaf spring 42 and a tip 43*a* of the leaf spring 43 directly below, and the distance L3 between the tip 43*a* of the leaf spring 43 and a tip 44*a* of the lowermost leaf spring 44 are equal.

Note that the leaf springs 41 to 44 are fixed to the bracket 32 in a cantilevered state, with the upper surface of the uppermost leaf spring 41 along and in contact with the lower surface of the cable carrier 30 or in close proximity with a small gap in the region between the folded portion 31*c* of the cable carrier 30 and the first end 31*a*.

In more detail, as shown in FIG. 5, the bracket 32 includes a first bracket 32*a* that fixes the cable carrier 30 to the upper frame 12 and a second bracket 32*b* fixed to the first bracket 32*a*. The first bracket 32*a* has a rectangular cross section having a flat lower surface portion 32*a*1. The second bracket 32*b* has a U-shaped cross section and includes an opposing surface portion 32*b*1 that faces the lower surface portion 32*a*1 from below and is parallel to the lower surface portion 32*a*1. The leaf springs 41 to 44 are, in a state of being placed between the lower surface portion 32*a*1 of the first bracket 32*a* and the opposing surface portion 32*b*1 of the second bracket 32*b*, fixed to the lower surface portion 32*a*1 and the opposing surface portion 32*b*1 by bolts 33 from both upper and lower sides.

With the mounting structure of the cable carrier 30 as described above, the cable carrier 30 is biased upward by the elastic member 40 in the region between the folded portion 31*c* and the first end 31*a*. Therefore, the sagging of the cable carrier 30 is suppressed, and damage to the cable carrier 30 due to the sagging is suppressed or prevented. Details are as follows.

Figures 7A, 7B:
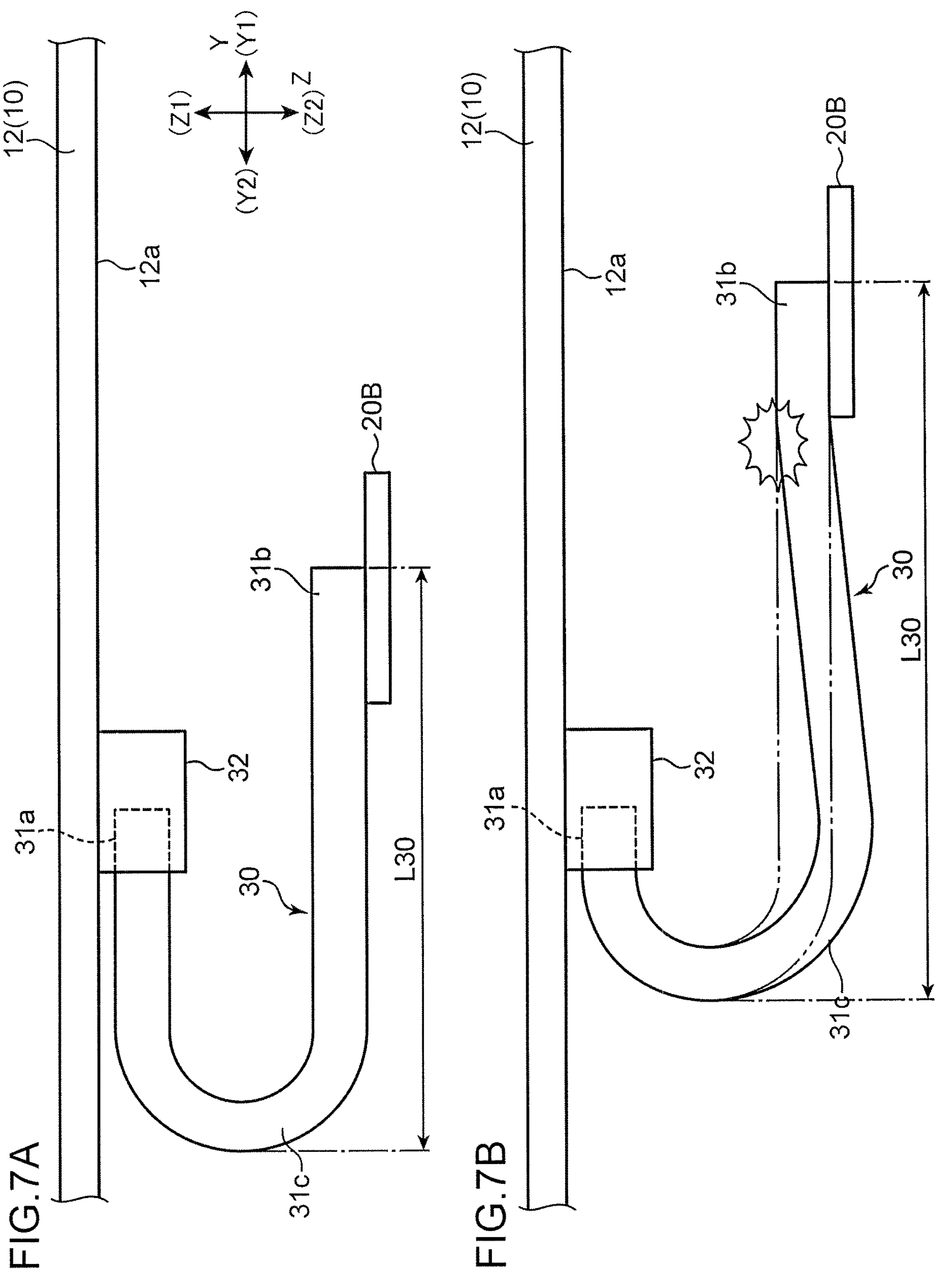
FIG. 7 is an explanatory diagram of problems in the mounting structure of the cable carrier.

The second head unit 6B (second head support member 20B) reciprocates in the Y direction within the movable region. In this case, for example, if the elastic member 40 is not provided as shown in FIG. 7(*a*), when the second head unit 6B (second head support member 20B) moves toward one stroke end (one end position of the movable region) and the distance L30 from the folded portion 31*c* of the cable carrier 30 to the second end 31*b* increases, as shown in FIG. 7(*b*), the cable carrier 30 tends to sag in the portion protruding from the second head support member 20B toward the Y2 side. This is due to the weight of the cable carrier 30 and the cable 22 inside the cable carrier 30 in the region from the folded portion 31*c* of the cable carrier 30 to the second end 31*b*. As described above, the cable carrier 30 can be bent (curved) into a U shape with a fixed radius, and is configured such that bending in the opposite direction to the bending direction is regulated. Therefore, when the cable carrier 30 sags as shown in FIG. 7(*b*), stress concentrates on the cable carrier 30 in the fixing portion of the second end 31*b*, particularly in this example, in the end part of the second head support member 20B (Y2 side end). In the worst case, the cable carrier 30 may be damaged int this part.

Figure 6:
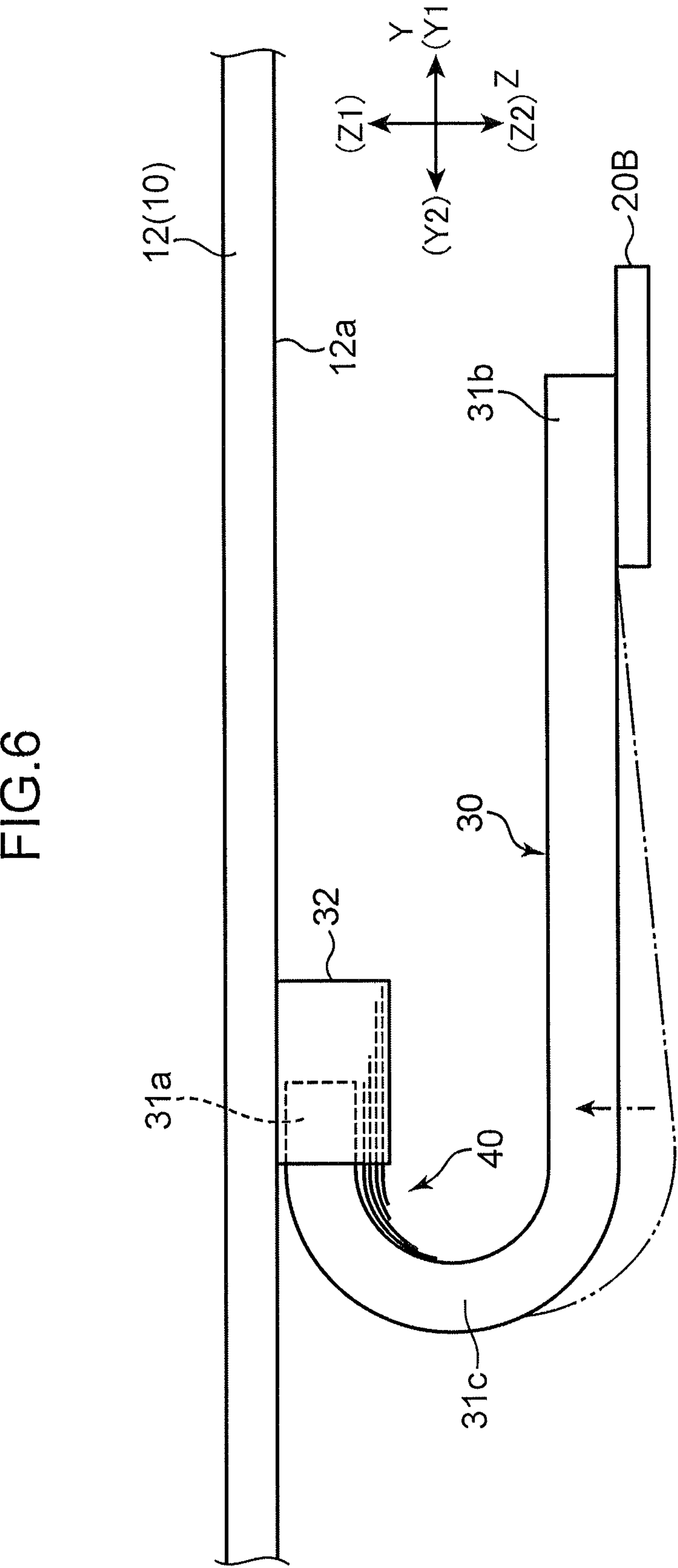
FIG. 6 is an explanatory diagram of the operational effect of the mounting structure of the cable carrier shown in FIG. 3.

However, with the mounting structure of the cable carrier 30 shown in FIG. 3, when the cable carrier 30 tends to sag, the cable carrier 30 is biased upward by the elastic member 40 (leaf springs 41 to 44). Therefore, as shown in FIG. 6, the sagging of the cable carrier 30 is suppressed, and as described above, stress concentration on a part of the cable carrier 30 and damage to the cable carrier 30 are suppressed or prevented.

In this case, since the elastic member 40 (leaf springs 41 to 44) is provided separately from the cable carrier 30, the weight of the cable carrier 30 is not increased. Therefore, with the mounting structure of the cable carrier 30 shown in FIG. 3, damage to the cable carrier 30 can be suppressed or prevented without hardly affecting the operating speed of the second head unit 6B and the like, as in the conventional technology.

With the mounting structure of the cable carrier 30 shown in FIG. 3, since the elastic member 40 includes the plurality of leaf springs 41 to 44, the biasing force of the elastic member 40 required to support the cable carrier 30 can be changed depending on the number of leaf springs. Therefore, selecting the number of leaf springs depending on the size and weight of the cable carrier 30 including the cable 22 housed and held makes it possible to effectively suppress the sagging of the cable carrier 30.

Each of the leaf springs 41 to 44 is stacked in a sequentially offset state by equal size in the Y direction such that the tip of the leaf spring located on the upper side is located closer to the folded portion 31*c* (Y2 side) than the tip of the leaf spring located directly below. That is, the leaf springs 41 to 44 are configured such that the elastic force of the leaf springs as a while gradually increases from the tip side toward the base end side (from the folded portion side of the cable carrier toward the first end side). Therefore, even when the second head unit 6B moves toward one stroke end and the distance from the folded portion 31*c* of the cable carrier 30 to the first end 31*a* becomes shorter, as shown in FIG. 6, the leaf springs 41 to 44 support the cable carrier 30 while being deflected and deformed from the tip side along the folded portion 31*c* of the cable carrier 30. Therefore, it is possible to suppress the sagging of the cable carrier 30 without applying almost any load to the cable carrier 30.

With the above-described configuration in which the elastic member 40 includes the leaf springs 41 to 44, the space occupied by the elastic member 40 in the up-and-down direction can be kept relatively small in the space between the first end 31*a* and the second end 31*b* of the cable carrier 30, that is, in the space inside the cable carrier 30 folded back in a U shape. Therefore, it is possible to utilize the space, for example, as an intervening space for other members that move together with the cable carrier 30*b* (second head unit 6B), and it is possible to suppress the sagging of the cable carrier 30 while maintaining the degree of freedom in designing the component mounting device 1.

By taking the cable carrier 30 in which the cable 22 of the second head unit 6B is housed and held as an example, the mounting structure thereof has been described above. However, the mounting structure of the cable carrier 30 in which the cable 22 for the first head unit 6A is housed is basically the same as the mounting structure of the cable carrier 30 in which the cable 22 for the second head unit 6B is housed and held, with only the difference in the orientation of the folded portion 31*c* and the orientation of the elastic member 40. Meanwhile, the mounting structure of the cable carrier 30 in which the cable 22 for the third head unit 6C and the fourth head unit 6D is housed is similar to the mounting structure of the cable carrier 30 in which the cable 22 for the first head unit 6A and the second head unit 6B is housed.

Note that the elastic member 40 shown in FIGS. 3 and 4 (first embodiment) is configured, as described above, by stacking the four leaf springs 41 to 44 including the same leaf spring in a state of being sequentially offset by an equal amount in the Y direction. However, the configuration of the elastic member 40 is not limited to this example. For example, this may be the configuration as shown in the following second to fifth embodiments.

Second Embodiment of Elastic Member 40

Figure 8:
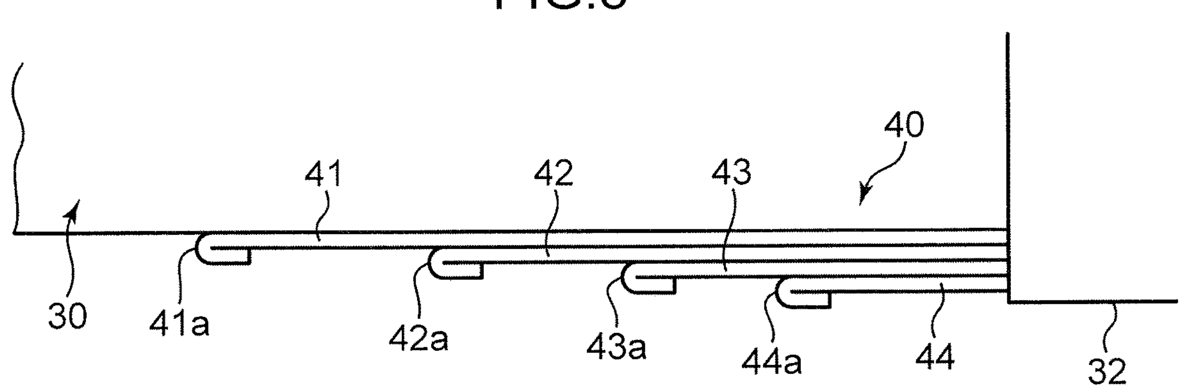
FIG. 8 is a side view showing an elastic member according to a second embodiment.

FIG. 8 shows an elastic member 40 according to the second embodiment. FIG. 8 is a figure corresponding to FIG. 4. The elastic member 40 of the second embodiment has the configuration in common with the elastic member 40 of the first embodiment in that four leaf springs 41 to 44 are stacked in a sequentially offset state by an equal amount in the Y direction. However, in the second embodiment, tips of the leaf springs 41 to 44 are each folded downward, causing all tips 41*a* to 44*a* of the leaf springs 41 to 44 to have rounded shapes. In this respect, the above configuration is different from the configuration of the elastic member 40 of the first embodiment.

The configuration of the elastic member 40 of the second embodiment has the effect of making it difficult for the tips 41*a* to 44*a* of the leaf springs 41 to 44 to damage a cable carrier 30 when the leaf springs 41 to 44 come into contact with the cable carrier 30.

Note that in the example in FIG. 8, the tips of all the leaf springs 41 to 44 are folded back. However, the leaf springs 42 to 44 other than the uppermost leaf spring 41 may not come into contact with the cable carrier 30 depending on distances L1, L2, L3 of the tips 41*a* to 44*a*. Therefore, the leaf springs 42 to 44 other than the uppermost leaf spring 41 may have a configuration in which the tip of only the leaf spring that comes into contact with the cable carrier 30 is folded back.

Third Embodiment of Elastic Member 40

Figure 9:
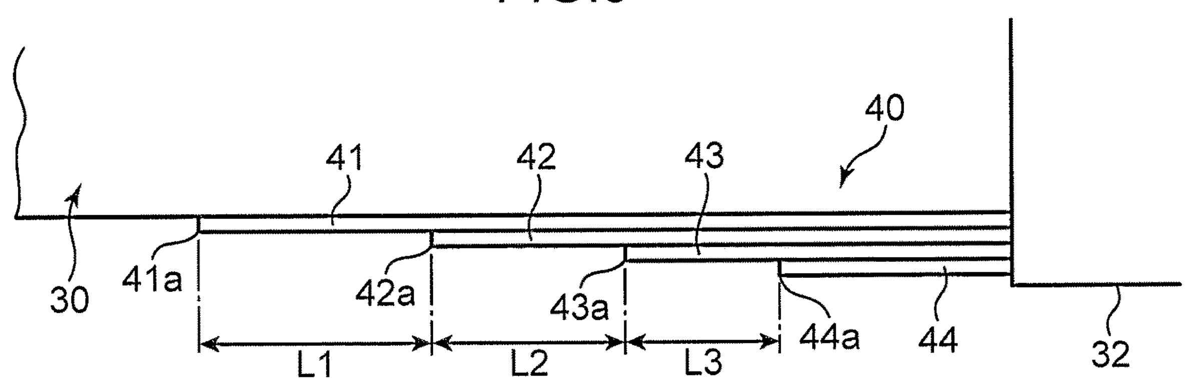
FIG. 9 is a side view showing an elastic member according to a third embodiment.

FIG. 9 shows an elastic member 40 according to the third embodiment. FIG. 9 is a figure corresponding to FIG. 4. The elastic member 40 of the third embodiment has the configuration in common with the elastic member 40 of the first embodiment in that four leaf springs 41 to 44 are stacked in a sequentially offset state in the Y direction. However, in the third embodiment, the leaf springs 41 to 44 are stacked such that the distances L1, L2, and L3 satisfy L1>L2>L3. In this respect, the above configuration is different from the configuration of the elastic member 40 of the first embodiment.

With this configuration, when a distance from a folded portion 31*c* of a cable carrier 30 to a first end 31*a* becomes shorter as a second head unit 6B moves, the leaf springs 41 to 44 are more easily deflected and deformed along the folded portion 31*c* of the cable carrier 30. Therefore, this is more advantageous than the first embodiment in that this configuration suppresses the sagging of the cable carrier 30 without application of a load to the cable carrier 30.

Fourth Embodiment of Elastic Member 40

Figure 10:
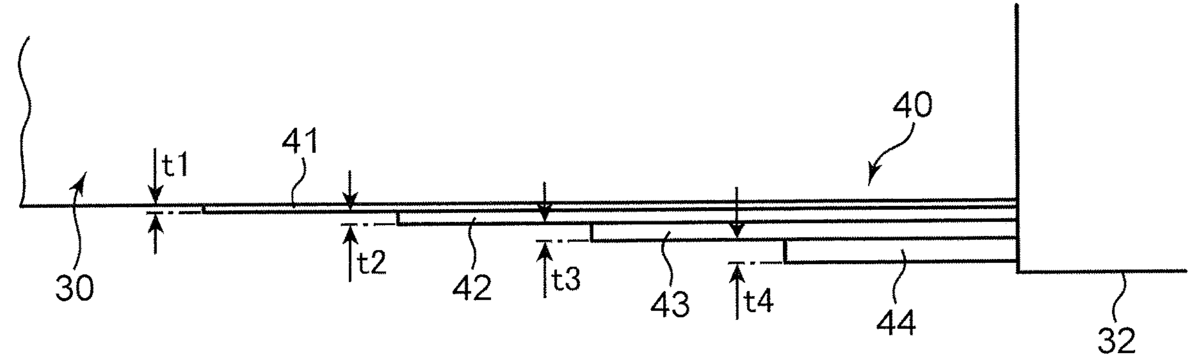
FIG. 10 is a side view showing an elastic member according to a fourth embodiment.

FIG. 10 shows an elastic member 40 according to the fourth embodiment. FIG. 10 is a figure corresponding to FIG. 4. The elastic member 40 of the fourth embodiment has the configuration in common with the elastic member 40 of the first embodiment in that four leaf springs 41 to 44 are stacked in a sequentially offset state by an equal amount in the Y direction. However, the fourth embodiment is configured such that the spring constant of the leaf spring located on the upper side is smaller than the spring constant of the leaf spring located directly below. In this respect, the above configuration is different from the configuration of the elastic member 40 of the first embodiment.

Specifically, when the plate thickness of the uppermost leaf spring 41 is t1, the plate thickness of the leaf spring 42 located directly below the leaf spring 41 is t2, the plate thickness of the leaf spring 43 located directly below the leaf spring 42 is t3, and the plate thickness of the lowermost leaf spring 44 is t4, the plate thicknesses of the leaf springs 41 to 44 are set to satisfy $t1<t2<t3<t4$.

Such a configuration of the elastic member 40 of the fourth embodiment also allows the plurality of leaf springs to be deflected and deformed more smoothly along a folded portion 31*c* of a cable carrier 30, in a similar manner to the third embodiment. Therefore, this is more advantageous than the first embodiment in that this configuration suppresses the sagging of the cable carrier 30 without application of a load to the cable carrier 30.

In the example in FIG. 10, the plate thicknesses t1 to t4 of each leaf spring 41 to 44 are varied, but for example, by making the plate thicknesses t1 to t4 of each leaf spring 41 to 44 the same and varying the material of each of the leaf springs 41 to 44, the leaf springs may be configured such that the spring constant of the leaf spring located on the upper side is made smaller than the spring constant of the leaf spring located directly below.

Fifth Embodiment of Elastic Member 40

Figure 11:
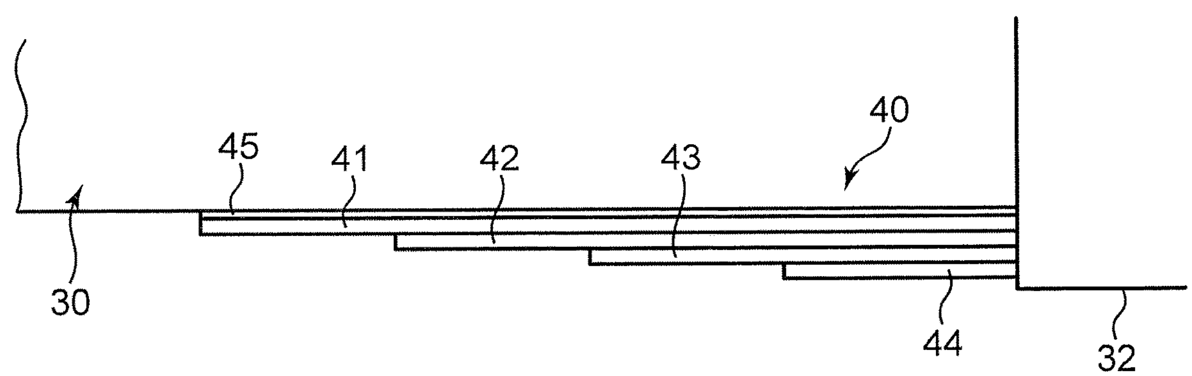
FIG. 11 is a side view showing an elastic member according to a fifth embodiment.

FIG. 11 shows an elastic member 40 according to the fifth embodiment. FIG. 11 is a figure corresponding to FIG. 4. The elastic member 40 of the fifth embodiment has the configuration in common with the elastic member 40 of the first embodiment in that four leaf springs 41 to 44 are stacked in a sequentially shifted state by an equal amount in the Y direction. However, in the fifth embodiment, on the upper surface of the uppermost leaf spring 41, a sliding surface part 45 having a lower coefficient of friction than the leaf spring 41 itself is provided. In this respect, the above configuration is different from the configuration of the elastic member 40 of the first embodiment.

Specifically, the sliding surface part 45 is provided by pasting a sliding tape on the upper surface of the leaf spring 41. The sliding tape is a synthetic resin tape having a surface with the lower coefficient of friction than the leaf spring 41, and for example, an ultrahigh molecular weight polyethylene tape, a fluororesin tape, and the like are applied.

With this configuration, the leaf spring 41 easily slides against a cable carrier 30. Therefore, there is an advantage that the leaf spring 41 is easily deflected and deformed along a folded portion 31*c* of the cable carrier 30. Note that other than pasting the sliding tape on the upper surface of the leaf spring 41, the sliding surface part 45 may be provided by, for example, being subjected to surface treatment such as DLC coating or fluororesin coating.

Sixth Embodiment of Elastic Member 4

Figure 12:
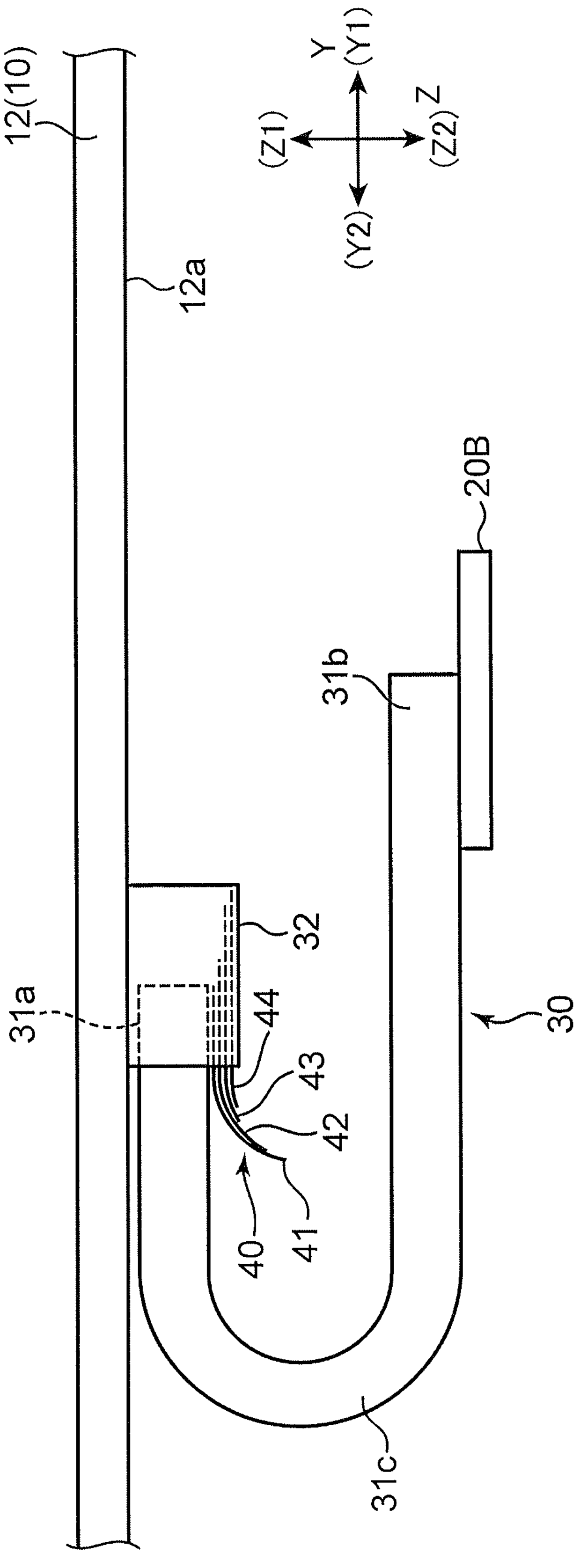
FIG. 12 is a side view showing an elastic member according to a sixth embodiment.

FIG. 12 shows an elastic member 40 according to the sixth embodiment. FIG. 12 is a figure corresponding to FIG. 3. The elastic member 40 of the sixth embodiment has the configuration in common with the elastic member 40 of the first embodiment in that four leaf springs 41 to 44 are stacked in a sequentially offset state by an equal amount. However, in the sixth embodiment, the upper leaf spring has a shape that curves downward together to wrap around the leaf spring directly below. In this respect, the above configuration is different from the configuration of the elastic member 40 of the first embodiment.

Since the leaf springs 41 to 44 originally have a curved shape, in a similar manner to the elastic member 40 of the second embodiment, this configuration has the effect of making it difficult for tips of the leaf springs 41 to 44 to damage a cable carrier 30 when the leaf springs 41 to 44 come into contact with the cable carrier 30.

Seventh Embodiment of Elastic Member 40

Figure 13:
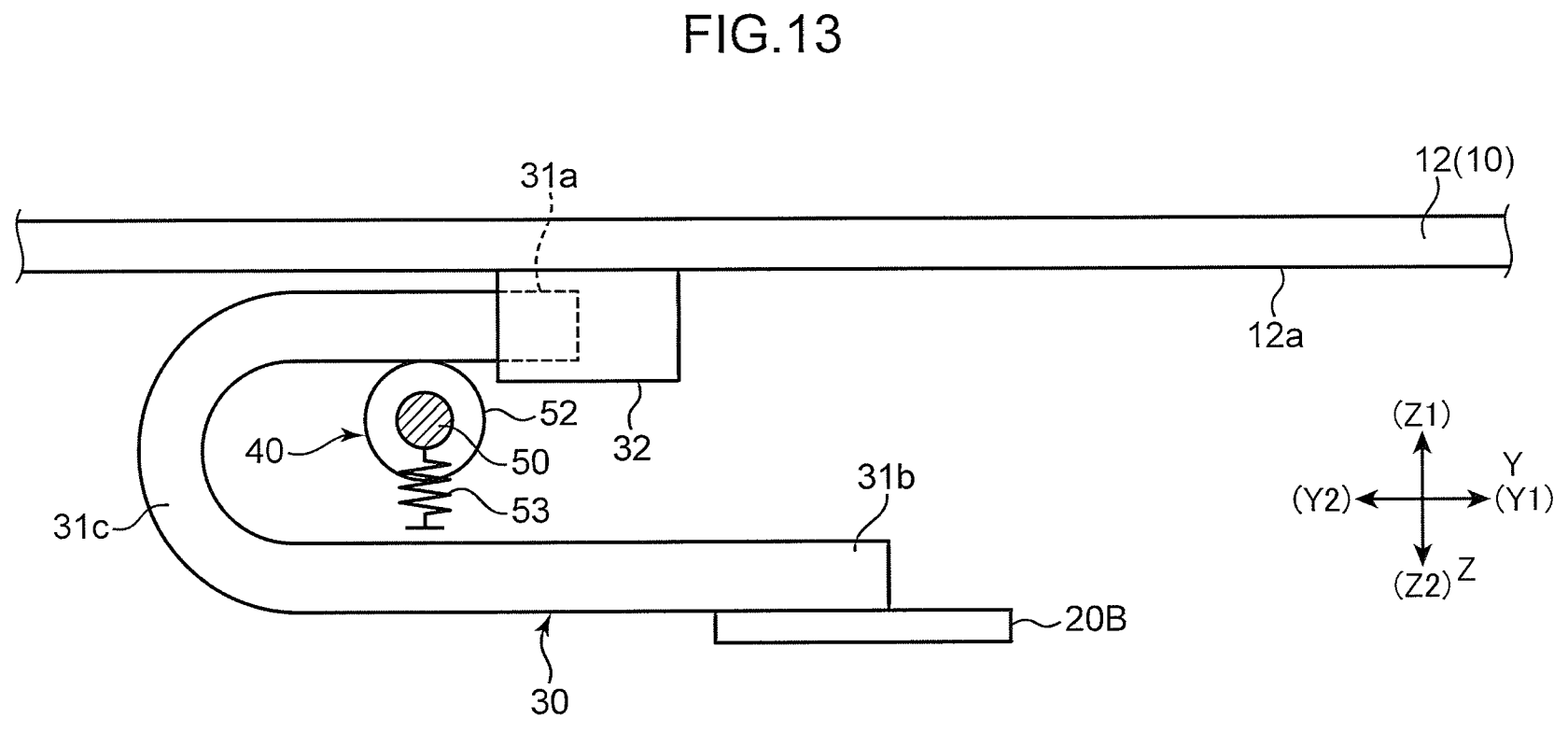

FIG. 13 shows an elastic member 40 according to the seventh embodiment. FIG. 13 is a figure corresponding to FIG. 3. The elastic member 40 of the seventh embodiment includes a shaft 50 extending in the X direction, a roller 52 rotatably provided on the outer peripheral surface thereof, and a coil spring 53 that biases the shaft 50 upward. The coil spring 53 biases a cable carrier 30 upward through the shaft 50 and the roller 52 to prevent the cable carrier 30 from sagging. Note that although shown schematically in FIG. 13, the shaft 50 and the coil spring 53 are supported by a frame 10. The roller 52 corresponds to the "rotating member" of the present disclosure, and the coil spring 53 corresponds to the "spring member" of the present disclosure.

In the elastic member 40 according to the seventh embodiment, by supporting the cable carrier 30 via the roller 52, sagging of the cable carrier is suppressed. Therefore, in a similar manner to the elastic member 40 of the first embodiment in which the elastic member 40 includes the leaf springs 41 to 44, the sagging of the cable carrier 30 can be effectively suppressed.

Other Modifications and the Like

The component mounting device 1 described above is illustration of preferred embodiments of the work device according to the present disclosure. The specific configuration, especially the mounting structure of the cable carrier 30 and the specific configuration of the elastic member 40 applied to the structure can be changed as appropriate without departing from the gist of the present disclosure.

For example, the elastic member 40 of the first to sixth embodiments has a configuration in which the four leaf springs 41 to 44 are stacked. However, the number of leaf springs constituting the elastic member 40 may be three or less, or may be five or more. The elastic member 40 of the first to third embodiments has a configuration in which the four same leaf springs are stacked, but may have a configuration in which two or more types of leaf springs having different widths (X-direction size) or lengths (Y-direction size) are stacked. In short, the number of leaf springs that constitute the elastic member 40, the material, shape, thickness, and the like of each leaf spring can be selected as appropriate such that the sagging of the cable carrier 30 can be suppressed. Therefore, it is also possible to apply the elastic member 40 having a configuration obtained by appropriately combining characteristic parts of the elastic member 40 of each of the first to sixth embodiments.

In the above embodiments, the first end 31*a* of the cable carrier 30 is fixed to the upper frame 12 via the bracket 32. However, the cable carrier 30 may have a configuration in which the first end 31*a* is directly fixed to the upper frame 12. In the configuration of this case, the first end 31*a* of the cable carrier 30 has a function as the "fixing portion" of the present disclosure.

The above embodiments have described the component mounting device 1 as one example of the work device of the present disclosure. However, the type of the work device of the present disclosure is not limited to the component mounting device 1 if the work device includes a movable work unit that performs various processes (work) on an object. The present disclosure is applicable to, for example, a printing device that performs the process of printing cream solder on a board (silk printing), a dispenser device that performs the process of applying cream solder or adhesive to a board, an inspection device that inspects a board by capturing an image of the board, and the like. The present disclosure is also applicable to an articulated robot.

The present disclosure described above is summarized as follows.

A work device according to one aspect of the present disclosure includes: a movable work unit that performs a predetermined process on an object; a cable carrier that includes a first end, a second end, and a folded portion that is folded in an up-and-down direction between the first end and the second end, the cable carrier housing and holding a cable connected to the work unit; a fixing portion that fixes the first end of the cable carrier to a predetermined position above a movable region of the work unit; a movable section that moves together with the work unit, the second end of the cable carrier being fixed to the movable section; and an elastic member that biases the cable carrier upward in a region between the folded portion and the first end to prevent the cable carrier from sagging.

In this work device, the movable section moves together with the work unit, and the cable carrier follows this movement. At this time, when the work unit (movable section) nears the stroke end (end position of the movable region) and the distance from the folded portion of the cable carrier to the second end increases, the cable carrier tends to sag due to the weight. However, in the work device, the elastic member supports and biases the cable carrier upward in the region between the folded portion of the cable carrier and the first end. Therefore, the sagging of the cable carrier is suppressed, and damage to the cable carrier due to the sagging is suppressed or prevented.

Moreover, since the elastic member is provided separately from the cable carrier, the weight of the cable carrier is not increased. Therefore, with this work device, it is possible to suppress or prevent damage to the cable carrier without affecting the operating speed of the work unit and the like.

As a specific configuration, the elastic member includes a leaf spring that biases the cable carrier upward at a position adjacent to the fixing portion.

With this configuration, the cable carrier is supported from below by the leaf spring in the region between the folded portion and the first end. That is, the cable carrier is biased upward by the elastic force (reaction force) of the leaf spring, thereby suppressing the sagging of the cable carrier. When the work unit (movable section) moves toward the stroke end and the distance from the folded portion to the first end becomes shorter, the leaf spring is deflected and deformed from the tip side along the folded portion of the cable carrier. Therefore, it is possible to support the cable carrier without applying an unnecessary load to the cable carrier.

With this configuration, the space occupied by the elastic member in the up-and-down direction can be kept relatively small in the space between the first end and the second end of the cable carrier (that is, in the space inside the cable carrier). Therefore, the space can be used, for example, as an intervening space for other members that move together with the movable section, improving the degree of freedom in designing the work device.

In this case, it is preferable that the elastic member includes a plurality of the leaf springs stacked in the up-and-down direction.

With this configuration, the biasing force required to support the cable carrier can be changed depending on the number of leaf springs. Therefore, selecting the number of leaf springs depending on the size and weight of the cable carrier makes it possible to highly suppress the sagging of the cable carrier.

In this case, it is preferable that the plurality of leaf springs is stacked such that a tip of the leaf spring located on an upper side is located closer to the folded portion than a tip of the leaf spring located directly below.

With this configuration, the elastic force (reactive force) of the plurality of leaf springs as a while gradually increases from the tip side toward the base end side (from the folded portion side of the cable carrier toward the first end side). Therefore, even if the work unit (movable section) moves toward the stroke end and the distance from the folded portion of the cable carrier to the first end becomes shorter, it is possible to support the cable carrier while smoothly deflecting and deforming the plurality of leaf springs from the tip side along the folded portion of the cable carrier. Therefore, it is possible to suppress the sagging of the cable carrier effectively without applying an unnecessary load to the cable carrier.

In this case, the plurality of leaf springs may include a first leaf spring, a second leaf spring stacked directly below the first leaf spring, and a third leaf spring stacked directly below the second leaf spring, and a distance between a tip of the first leaf spring and a tip of the second leaf spring may be larger than a distance between the tip of the second leaf spring and a tip of the third leaf spring.

With this configuration, it is possible to deflect and deform the plurality of leaf springs more smoothly along the folded portion of the cable carrier.

In the above configuration, the leaf spring located on the upper side may have a smaller spring constant than the leaf spring located directly below. For example, the leaf spring located on the upper side may have a smaller thickness than the leaf spring located directly below.

With such a configuration as well, when the work unit (movable section) moves toward the stroke end and the distance from the folded portion of the cable carrier to the first end becomes shorter, it is possible to smoothly deflect and deform the plurality of leaf springs from the tip side along the folded portion.

In the above work device, it is preferable that, among the plurality of leaf springs, the tip of at least the uppermost leaf spring is folded back.

With this configuration, since the tip of the leaf spring has a rounded shape, when coming into contact with the cable carrier, the tip of the leaf spring damaging the cable carrier is suppressed or prevented.

In the above work device, the leaf spring located on the upper side and the leaf spring located directly below may both be curved downward such that the upper leaf spring wraps around the leaf spring directly below.

With this configuration, since the upper leaf spring is curved downward to wrap around the leaf spring directly below, in this case as well, it is possible to support the cable carrier by the plurality of leaf springs without damaging the cable carrier by the tips of the leaf springs.

In the above work device, it is preferable that, among the plurality of leaf springs, on an upper surface of the uppermost leaf spring, a sliding surface part having a smaller coefficient of friction than the leaf spring itself is provided.

With this configuration, sliding friction between the uppermost leaf spring and the cable carrier is reduced. Therefore, when the work unit (movable section) moves toward the stroke end and the distance from the folded portion of the cable carrier to the first end becomes shorter, it is possible to more smoothly deflect and deform the uppermost leaf spring.

Note that in the above work device, the elastic member may include: a rotating member rotatably supported at a position adjacent to the fixing portion; and a spring member that biases the rotating member upward.

With this configuration, the cable carrier is elastically supported via the rotating member in the region between the folded portion and the first end. Therefore, in a similar manner to the above configuration in which the elastic member includes the leaf spring, it is possible to suppress sagging of the cable carrier.

The invention claimed is:

1. A work device comprising:

a movable work unit configured to perform a predetermined process on an object;

a cable carrier that includes a first end, a second end, and a folded portion that is folded in an up-and-down direction between the first end and the second end, the cable carrier housing and holding a cable connected to the work unit;

a fixing portion configured to fix the first end of the cable carrier to a predetermined position above a movable region of the work unit;

a movable section configured to move together with the work unit, the second end of the cable carrier being fixed to the movable section; and an elastic member configured to bias the cable carrier upward in a region between the folded portion and the first end to prevent the cable carrier from sagging.

2. The work device according to claim 1, wherein the elastic member includes a leaf spring that is configured to bias the cable carrier upward at a position adjacent to the fixing portion.

3. The work device according to claim 2, wherein the elastic member includes a plurality of the leaf springs stacked in the up-and-down direction.

4. The work device according to claim 3, wherein the plurality of leaf springs is stacked such that a tip of the leaf spring located on an upper side is closer to the folded portion than a tip of the leaf spring located directly below.

5. The work device according to claim 4, wherein the plurality of leaf springs includes a first leaf spring, a second leaf spring stacked directly below the first leaf spring, and a third leaf spring stacked directly below the second leaf spring, and a distance between a tip of the first leaf spring and a tip of the second leaf spring is larger than a distance between the tip of the second leaf spring and a tip of the third leaf spring.

6. The work device according to claim 4, wherein the leaf spring on the upper side has a smaller spring constant than the leaf spring located directly below.

7. The work device according to claim 6, wherein the leaf spring on the upper side has a smaller plate thickness than the leaf spring located directly below.

8. The work device according to claim 3, wherein among the plurality of leaf springs, the tip of at least the uppermost leaf spring is folded back.

9. The work device according to claim 4, wherein the leaf spring on the upper side and the leaf spring directly below are both curved downward such that the upper leaf spring wraps around the leaf spring directly below.

10. The work device according to claim 3, wherein among the plurality of leaf springs, an upper surface of the uppermost leaf spring includes a sliding surface part having a smaller coefficient of friction than the leaf spring itself.

11. The work device according to claim 1, wherein the elastic member includes: a rotating member rotatably supported at a position adjacent to the fixing portion; and a spring member that is configured to bias the rotating member upward.

12. The work device according to claim 5, wherein the leaf spring on the upper side has a smaller spring constant than the leaf spring located directly below.

13. The work device according to claim 4, wherein among the plurality of leaf springs, the tip of at least the uppermost leaf spring is folded back.

14. The work device according to claim 5, wherein among the plurality of leaf springs, the tip of at least the uppermost leaf spring is folded back.

15. The work device according to claim 6, wherein among the plurality of leaf springs, the tip of at least the uppermost leaf spring is folded back.

16. The work device according to claim 7, wherein among the plurality of leaf springs, the tip of at least the uppermost leaf spring is folded back.

17. The work device according to claim 5, wherein the leaf spring on the upper side and the leaf spring directly below are both curved downward such that the upper leaf spring wraps around the leaf spring directly below.

18. The work device according to claim 6, wherein the leaf spring on the upper side and the leaf spring directly below are both curved downward such that the upper leaf spring wraps around the leaf spring directly below.

19. The work device according to claim 4, wherein among the plurality of leaf springs, an upper surface of the uppermost leaf spring includes a sliding surface part having a smaller coefficient of friction than the leaf spring itself.

20. The work device according to claim 5, wherein among the plurality of leaf springs, an upper surface of the uppermost leaf spring includes a sliding surface part having a smaller coefficient of friction than the leaf spring itself.

* * * * *